(12) United States Patent
Richardson et al.

(10) Patent No.: US 6,614,269 B1
(45) Date of Patent: Sep. 2, 2003

(54) INTEGRATED POLYPHASE AMPLITUDE DETECTOR

(75) Inventors: Kenneth G. Richardson, Erie, CO (US); Peter Windler, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/217,785

(22) Filed: Aug. 13, 2002

(51) Int. Cl.$^7$ .................. H03D 1/00; G01R 19/00

(52) U.S. Cl. ........................... 327/58; 327/50

(58) Field of Search ................ 327/50, 58, 62, 327/63, 70, 71, 2, 3, 100, 101, 54

(56) References Cited

U.S. PATENT DOCUMENTS

| | | | | | |
|---|---|---|---|---|---|
| 5,491,434 A | * | 2/1996 | Harnishfeger et al. | ........ | 327/50 |
| 6,118,333 A | * | 9/2000 | Oda | ........................... | 327/560 |
| 6,377,844 B1 | * | 4/2002 | Graen | ........................ | 600/521 |

* cited by examiner

Primary Examiner—Dinh T. Le
(74) Attorney, Agent, or Firm—Trexler, Bushnell, Giangiorgi, Blackstone & Marr Ltd.

(57) ABSTRACT

A polyphase amplitude detector for detecting the amplitude of a polyphase signal. The polyphase amplitude detector includes means for generating differential pair signals. The differential pair signals are buffered and amplified and then AC coupled to the amplitude detector. The amplitude detector detects the amplitude of each phase of the polyphase signal and generates output signals which are used to control the amplitude of the polyphase signal.

12 Claims, 6 Drawing Sheets

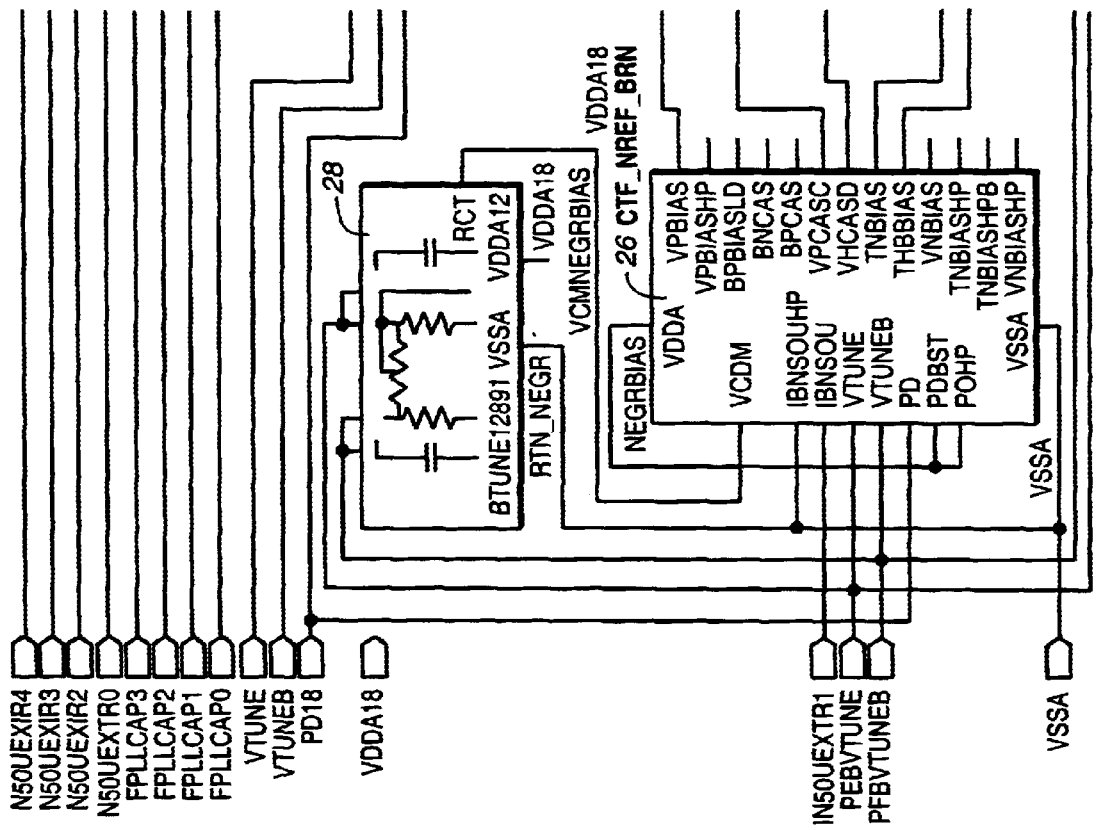
FIG._1A
FIG._1
FIG._1A  FIG._1B  FIG._1C

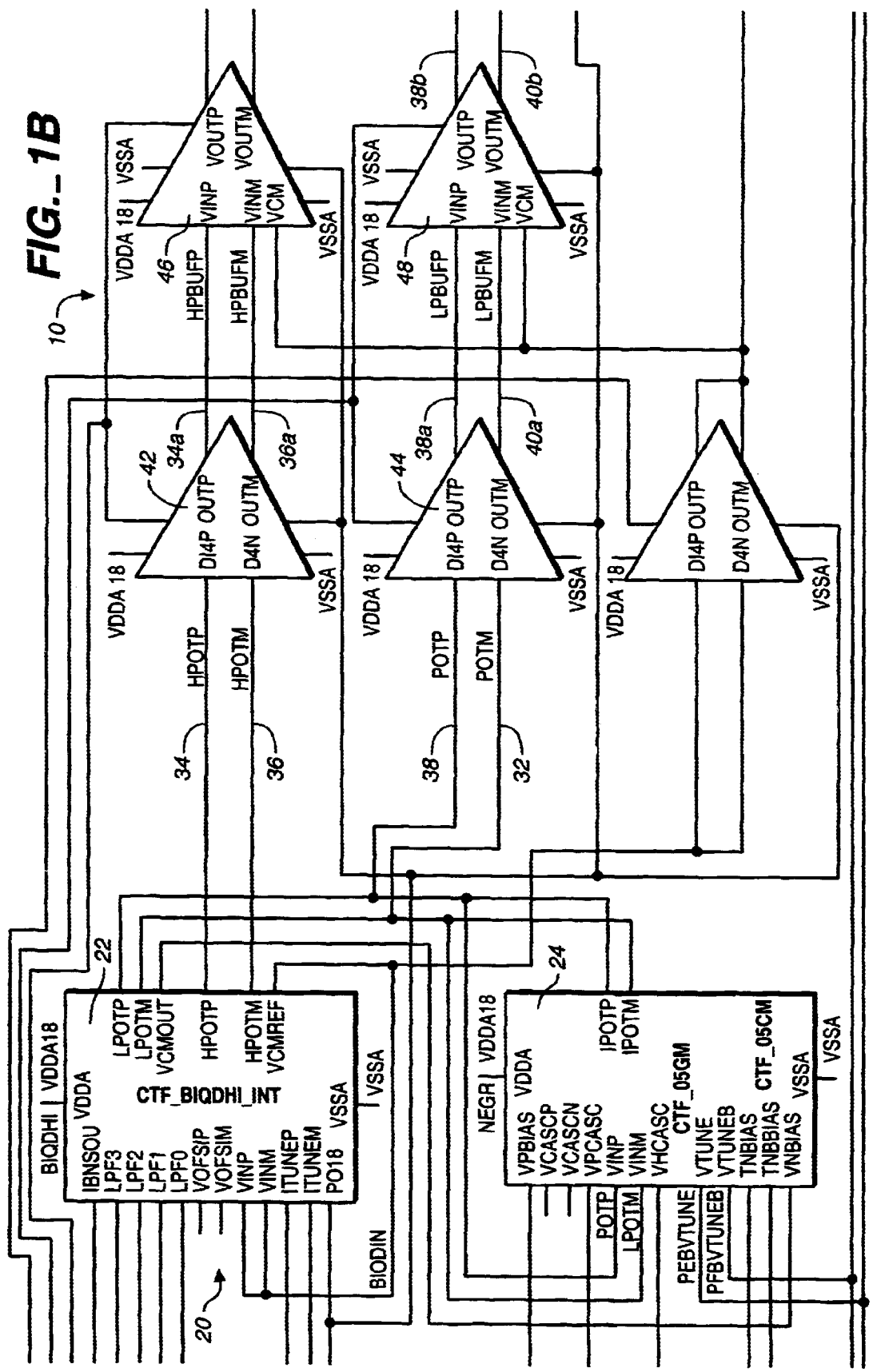
FIG._1B

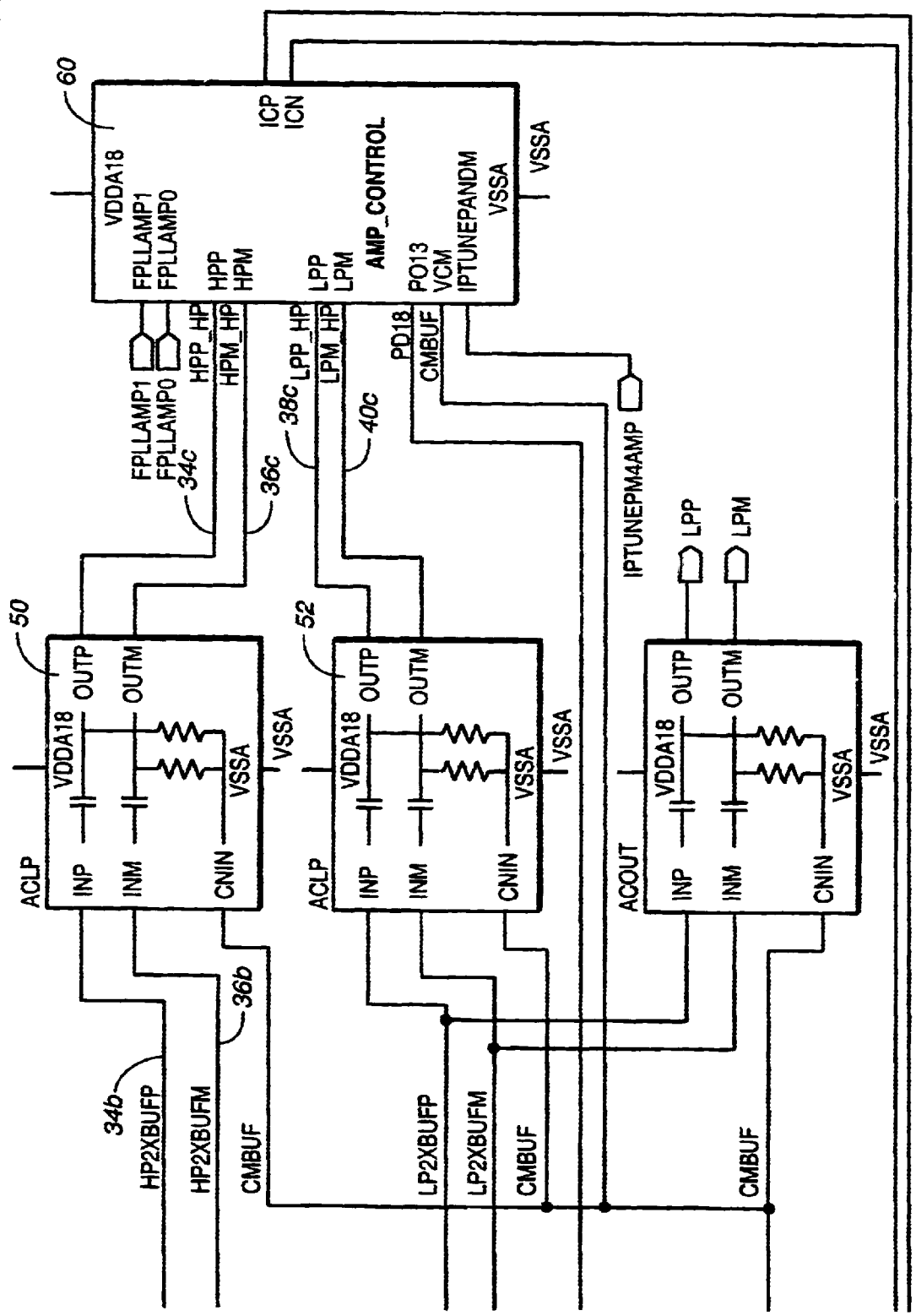
FIG._1C

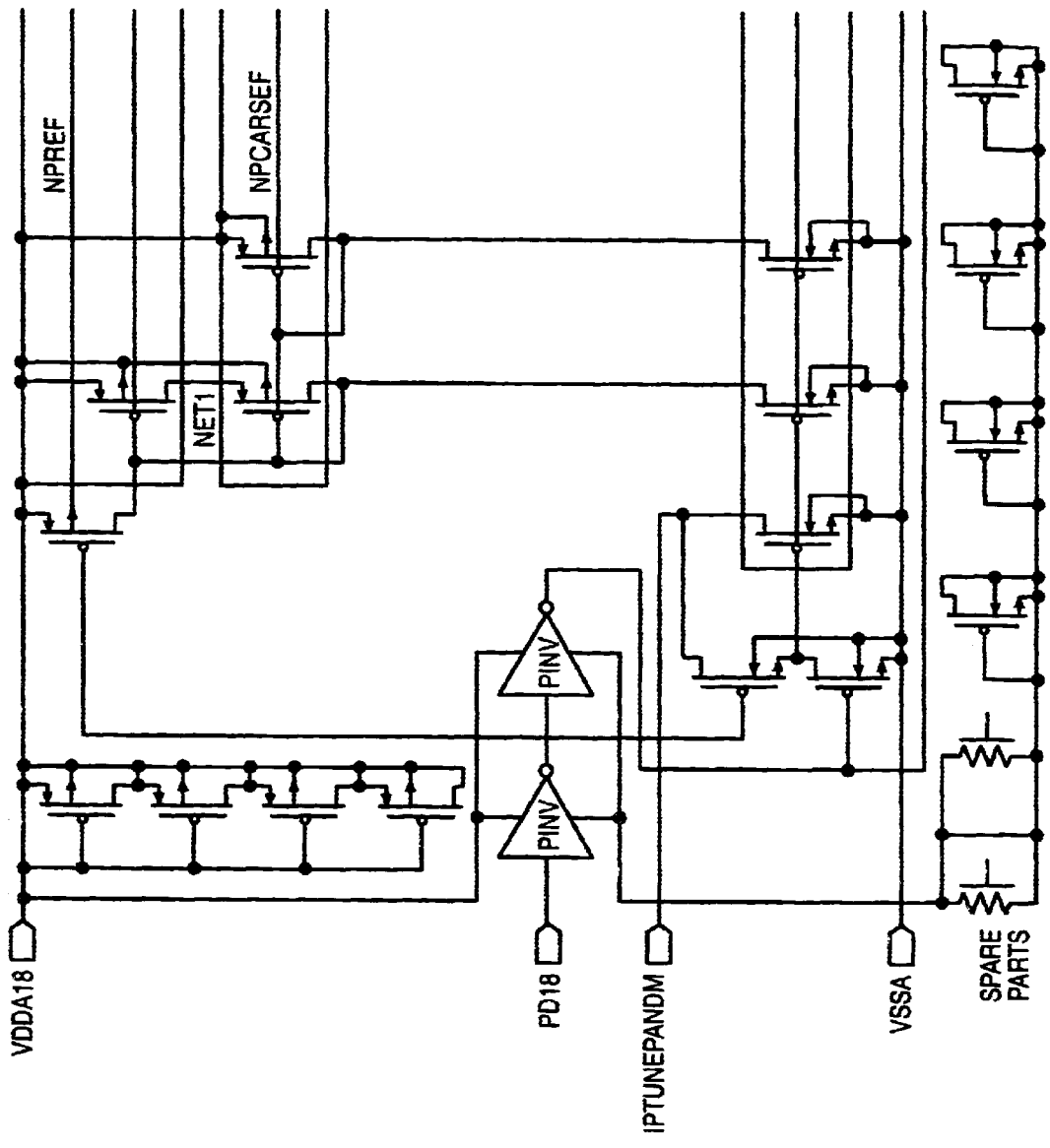

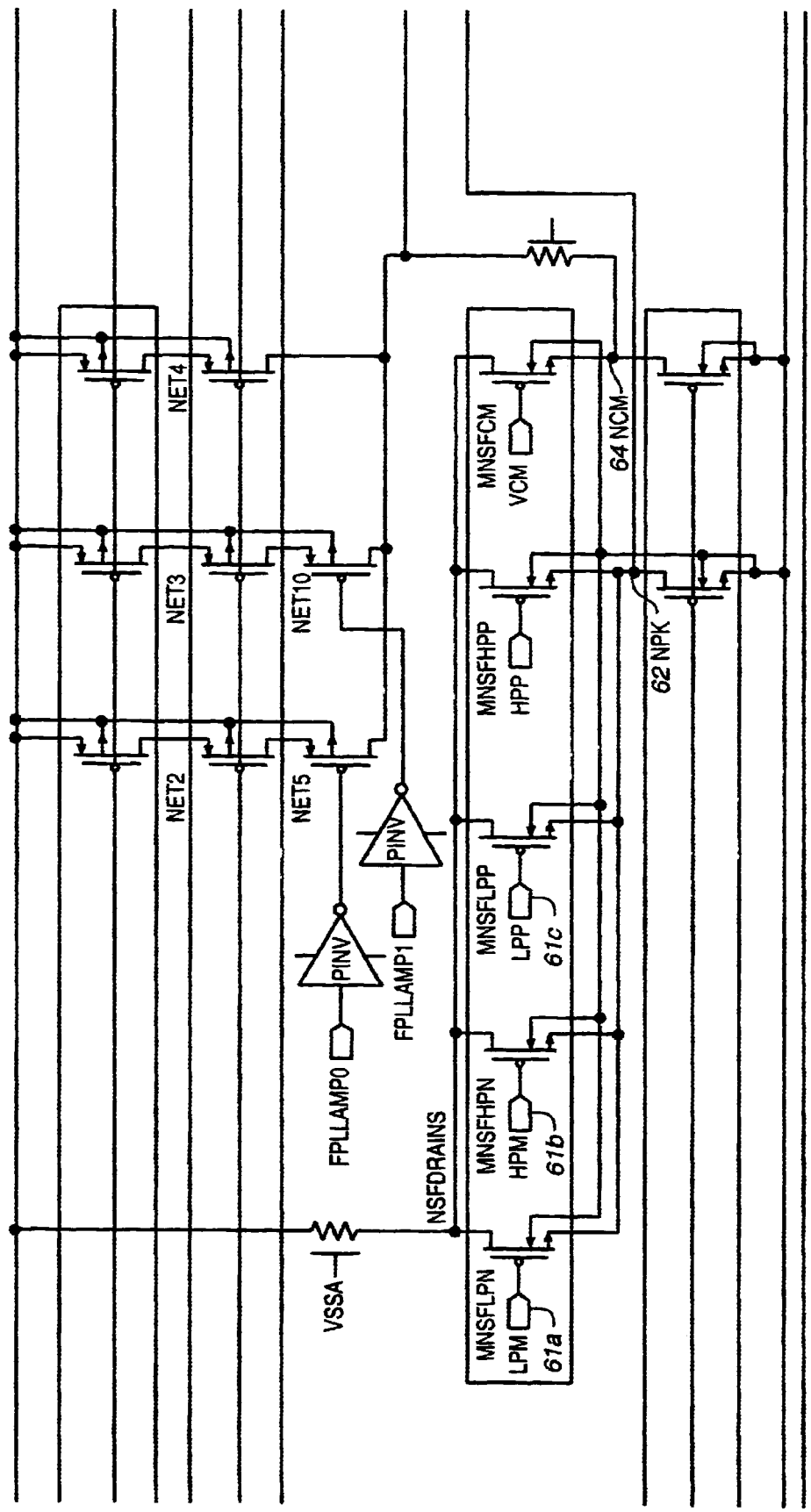
FIG._2B

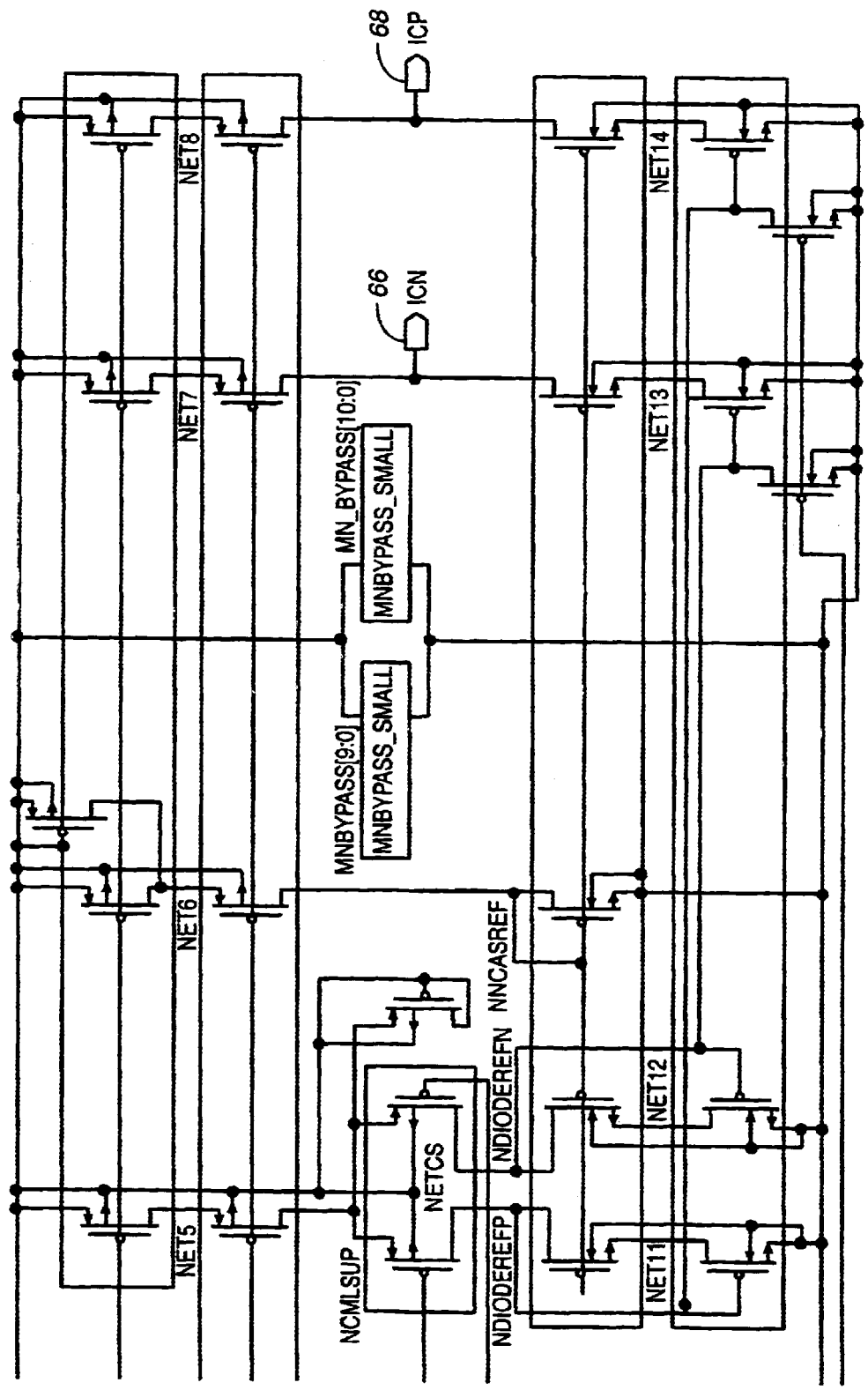
FIG._2C

INTEGRATED POLYPHASE AMPLITUDE DETECTOR

BACKGROUND

The present invention generally relates to polyphase amplitude detection.

Polyphase amplitude detection is widely used in power electronics but applications in integrated circuits have been limited.

Tuning circuits to cancel process, voltage and temperature variation and to allow continuous tuning/tracking operation of filters and other functions are widely used in integrated circuits.

A significant number of these tuning circuits are based on Gyrators which can be connected to form an oscillator. Techniques to control the amplitude of oscillators have become more complicated as the ratio of power supply voltage to nominal threshold have decreased with advancing process technology. Irrespective of the technology changes, there is a need for improved stability and response time of amplitude control loops.

A typical oscillator will have a port to control the gain of the feedback loop. As the loop gain approaches unity, the system poles move onto the j-omega axis and the system response from port to output amplitude can be described as K/s or a pure integrator. A simple zero-phase feed back network can be used to close such a loop but most full-wave and half-wave circuits have large dominant poles. A good polyphase rectifier operating from a quadrature source will have a much lower ripple and thus a smaller need to filter thus improving the system response and stability. In the case where the amplitude detector is designed to generate the square of the input, a sine squared and a cosine squared will sum to one eliminating almost any need for the filter.

One problem with a standard peak detector is that one input is source followed into a node with a small leaker current to ground plus a parallel capacitor to ground. This approach is sensitive to the frequency being detected because the detected peak erodes as current is pulled from the capacitor.

OBJECTS AND SUMMARY

A general object of an embodiment of the present invention is to provide a polyphase amplitude detector for use in an integrated circuit.

Another object of an embodiment of the present invention is to provide an amplitude detector for detecting the amplitude of each phase of a signal where the number of sinusoids is greater than one and the phase relationship between the signals is offset.

Briefly, and in accordance with at least one of the forgoing objects, an embodiment of the present invention provides an integrated polyphase amplitude detector which includes means to detect the amplitude of each phase of a signal where the number of sinusoids is greater than one and the phase relationship between the signals is offset.

BRIEF DESCRIPTION OF THE DRAWINGS

The organization and manner of the structure and operation of the invention, together with further objects and advantages thereof, may best be understood by reference to the following description, taken in connection with the accompanying drawing, wherein FIG. 1 is a schematic drawing of an integrated polyphase amplitude detector which is in accordance with an embodiment of the present invention; and FIG. 2 is a schematic drawing of an amplitude control circuit of the integrated polyphase detector of FIG. 1.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 illustrates an integrated polyphase amplitude detector 10 which is in accordance with an embodiment of the present invention. Many aspects of what is shown in FIG. 1 would be readily understood by one having ordinary skill in the art while reviewing FIG. 1. Those aspects of FIG. 1 which directly relate to the present invention are described hereinbelow. The integrated polyphase amplitude detector 10 is configured to buffer and amplify the signals whose amplitude are being controlled.

The integrated polyphase amplitude detector 10 includes VCO 20. VCO 20 is comprised of CTF_BIQDHI$_{13}$ INT 22 and CTF$_{13}$ 05GM 24 plus CTF$_{13}$ BREF$_{13}$ BRN 26 and RTN$_{13}$ NEGR 28. VCO 20 outputs two differential pair signals 30, 32. The first differential pair 30 includes signals HPOTP 34 and HPOTM 36. The second differential pair 32 includes signals LPOTP 38 and LPOTM 40. The differential output pairs 30, 32 are 90 degrees out of phase. If the differential pair signals 34, 36, 38, and 40 are plotted on top of each other, the result is a signal peak every 90 degrees.

A first buffer 42 receives the first pair of signals 34, 36. A second buffer 44 receives the second pair of signals 38, 40. Buffered signals 34a, 36a are provided by the first buffer 42.

Buffered signals 38a, 40a are provided by the second buffer 44. A first amplifier 46 receives the buffered signals 34a, 36a. A second amplifier 48 receives the buffered signals 38a, 40a. Amplified signals 34b, 36b are provided by the first amplifier 46. The amplified signals 34b, 36b are two times (or 6 dB) greater than the input signals 34a, 36a. Amplified signals 38b, 40b are provided by the second amplifier 48. The amplified signals 38b, 40b are two times (or 6 dB) greater than the input signals 38a, 40a.

Amplified signals 34b, 36b are provided to an AC coupling circuit 50 which generates a first quadrature signal 34c and a second quadrature signal 36c. Amplified signals 38b, 40b are provided to an AC coupling circuit 52 which generates a third quadrature signal 38c and a fourth quadrature signal 40c. Circuit 50 AC couples the signals 34b, 36b with a four phase peak detector 60. Circuit 52 AC couples the signals 38b, 40b with the four phase peak amplitude detector 60. AC coupling of the quadrature signals 34c, 36c, 38c, 40c reduces the errors contributed by offsets in the outputs of the VCO 20, buffers 42, 44 and the amplifiers, 46, 48.

A detailed schematic of the four phase peak amplitude detector AMP$_{13}$ CONTROL 60 is shown in FIG. 2. The amplitude detector 60 includes MNSFLP N, P and MNSFHP N, P. The amplitude detect or polyphase detection is performed by source followers LPM 61a, HPM 61b, LPP 61c, and HPP 61d inside the amplitude detector 60. The peak of any one of the four quadrature signals 34c, 36c, 38c, 40c is maintained on node NPK 62, where it is compared to node NCM 64.

The remainder of the amplitude detector circuit 60, such as, for example, the PFET differential pair that follows, uses these two signals NPK 62 and NCM 64 to control the VCO amplitude via the first output ICN 66 and the second output ICP 68.

Node NPK 62 represents the maximum voltage of any one of the four quadrature signals 34c, 36c, 38c, 40c directly, unlike the previous standard peak detectors where one input is source followed into a node with a small leaker current to ground plus a parallel capacitor to ground. This previous approach is sensitive to the frequency beign detected because the detected peak erodes as current is pulled from the capacitor. In the polyphase approach of the present invention, the amplitude detector 60 is not sensitive to frequency because there is no leaker current to ground with a parallel capacitor to ground. Therefore, the detected peak does not erode as current is pulled from the capacitor. Thus, the polyphase amplitude detector 10 is not frequency dependent.

The detector 10 can be viewed as two single phase full-wave detectors with the outputs connected or as four half wave circuits with all of their outputs tied together. The detector 10 includes plural means to detect the amplitude of each phase of the signal where the number of sinusoids is greater than one and the phase relationship between the signals is offset. More precisely, a multi-phase detector rather than a single phase full wave detector or two half wave circuits.

Note that the amplitude of gyrator oscillator normal and quadrature outputs may not be equal. For best polyphase results the amplitudes should be within a few percent for the 90 degree case. That is why the buffers are key. In case where the various phases are not of equal amplitude or of the correct phase relationship, the buffers can be used to adjust the amplitude to the desired values. The resulting vector sums can then be detected by differential means.

The detector 10 also includes means to sum the outputs of the amplitude detectors.

In the current embodiment, the buffers also give a 2× gain that improves the response of the four phase peak detector made up of MNSFLP N, P and MNSFHP N, P.

In an alternative embodiment to the embodiment shown, the quadrature signals 34c, 36c, 38c, 40c could be sent to other types of amplitude detectors.

In the particular application described, first and second signals 34, 36 and third and fourth signals 38, 40 have the same amplitude. Therefore, each buffer path 42, 46 and 44, 48 has the same gain. If one VCO output 30, 32 has a lower amplitude than the other, these buffer gain stages would have different gains to generate quadrature signals 34c, 36c, 38c, 40c having the same amplitude to be provided to the amplitude detector 60.

While an embodiment of the present invention is shown and described, it is envisioned that those skilled in the art may devise various modifications of the present invention without departing from the spirit and scope of the appended claims.

What is claimed is:

1. A polyphase amplitude detector for detecting the amplitude of a polyphase signal including:
   receiving means for receiving said polyphase signal and generating differential pair signals,
   plural buffer means for buffering said differential pair signals, an amplitude detector for detecting the amplitude of each phase and for generating output signals, and
   plural coupling means for AC coupling said differential pair signals to said amplitude detector.

2. A polyphase amplitude detector as defined in claim 1, further including plural amplification means wherein said plural amplification means receive signals from said plural buffer means and provide amplified signals to said plural coupling means.

3. A polyphase amplitude detector as defined in claim 1, wherein said plural coupling means includes a first AC coupling circuit and a second AC coupling circuit and wherein said first AC coupling circuit generates a first quadrature signal and a second quadrature signal, and said second coupling circuit generates a third quadrature signal and a fourth quadrature signal.

4. A polyphase amplitude detector as defined in claim 1, wherein said amplitude detector includes a plurality of source followers.

5. A polyphase amplitude detector as defined in claim 3, further including a peak node signal and a control node signal, wherein a peak amplitude of one of said first quadrature signal, said second quadrature signal, said third quadrature signal and said fourth quadrature signal provides said peak node signal and said peak node signal is compared to said control node signal.

6. A polyphase amplitude detector as defined in claim 5, wherein the amplitude of said polyphase signal is controlled using said peak node signal and said control node signal.

7. A polyphase amplitude detector as defined in claim 1, wherein said detector is not frequency dependent.

8. A polyphase amplitude detector as defined in claim 1, further including summing means for summing said output signals.

9. A polyphase amplitude detector including:
   a first buffer configured to receive a first signal and a second signal and configured to generate a first buffered signal and said second buffered signal;
   a second buffer configured to receive a third signal and a fourth signal and configured to generate a third buffered signal and a fourth buffered signal;
   a first amplifier configured to receive said first buffered signal and said second buffered signal from said first buffer, to amplify said first buffered signal and said second buffered signal and to generate a first amplified signal and a second amplified signal;
   a second amplifier configured to receive said third buffered signal and said fourth buffered signal from said second buffer, to amplify said third buffered signal and said fourth buffered signal and to generate a third amplified signal and a fourth amplified signal;
   a first coupler configured to receive said first amplified signal and said second amplified signal from said first amplifier and to generate a first quadrature signal and a second quadrature signal;
   a second coupler configured to receive said third amplified signal and said fourth amplified signal from said second amplifier and to generate a third quadrature signal and a fourth quadrature signal;
   an amplitude detector configured to receive said first, second, third and fourth quadrature signals and to generate a first output and a second output; and
   wherein the amplitude of said first, second, third and fourth signals is controlled by said first output and said second output.

10. An polyphase amplitude detector as defined in claim 9, wherein said amplitude detector further includes:

a first node;

a second node;

wherein a peak value of the amplitude of said first quadrature signal, said second quadrature signal, said third quadrature signal or said fourth quadrature signal is maintained on said first node;

wherein said value on said first node is compared to said value on said second node; and wherein said value on said first node and said value on said second node is used to control the amplitude of said first signal, said second signal, said third signal and said fourth signal via said first output signal and said second output signal.

11. An amplitude detector as defined in claim 9, wherein the first amplified signal is approximately twice the amplitude of said first buffered signal and said second amplified signal is approximately twice the amplitude of said second buffered signal.

12. An amplitude detector as defined in claim 9, wherein the third amplified signal is approximately twice the amplitude of said third buffered signal and said fourth amplified signal is approximately twice the amplitude of said fourth buffered signal.

* * * * *